United States Patent

[11] 3,611,063

[72] Inventor Ronald George Neale
Birmingham, Mich.
[21] Appl. No. 825,235
[22] Filed May 16, 1969
[45] Patented Oct. 5, 1971
[73] Assignee Energy Conversion Devices, Inc.
Troy, Mich.

[54] AMORPHOUS ELECTRODE OR ELECTRODE SURFACE

5 Claims, 8 Drawing Figs.

[52] U.S. Cl. .......... 317/234 R, 317/234 N, 317/234 V, 317/235 P, 338/20
[51] Int. Cl. .......... H01l 3/00, H01l 7/00, H01l 9/00
[50] Field of Search .......... 317/234 (10), 234 (5.2); 117/107

[56] References Cited

UNITED STATES PATENTS

| | | | |
|---|---|---|---|
| 2,917,442 | 12/1959 | Hanlet | 204/192 |
| 3,021,271 | 2/1962 | Wehner | 204/192 |
| 3,160,576 | 12/1964 | Eckert | 204/192 |
| 3,161,946 | 12/1964 | Birkenbeil | 204/192 X |
| 3,271,591 | 9/1966 | Ovshinsky | 317/234 UX |
| 3,327,137 | 6/1967 | Ovshinsky | 317/234 UX |

*Primary Examiner*—James D. Kallam
*Assistant Examiner*—William D. Larkins
*Attorneys*—Wallenstein, Spangenberg, Hattis & Strampel and Edward G. Fiorito

ABSTRACT: A semiconductor switch device includes an active semiconductor material, which is substantially disordered and generally amorphous and of high resistance, and which is interposed between a pair of electrodes, the switch device blocking current flow. When a voltage greater than a threshold voltage value is applied to the electrodes, at least one current conducting path is established between the electrodes to cause the switch device to conduct. The switch device may be a nonmemory type or memory type, the former reverting to the blocking state when the current therethrough decreases below a minimum current holding value, and the latter remaining in its conducting state until it is realtered to the blocking state by the application of a current pulse to the electrodes. The active semiconductor material and the electrodes are deposited as films on a suitable substrate. To assure that the active semiconductor material assumes the substantially disordered and generally amorphous state and remains in that state and to assure maximum electrical contact with and strong mechanical adhesion with the electrodes, the electrodes are also made in a substantially disordered and generally amorphous state.

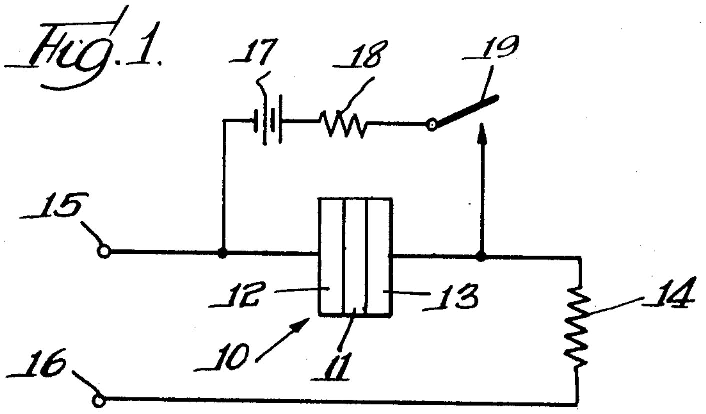
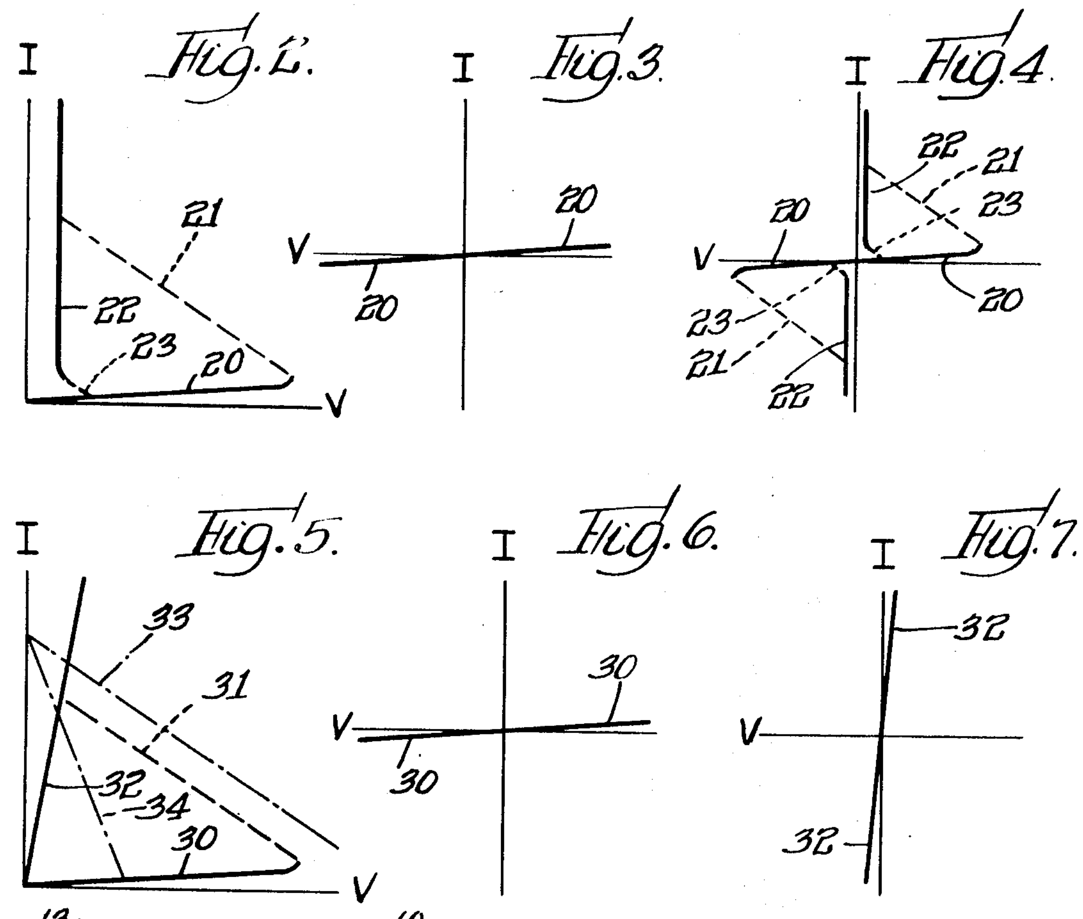
Fig. 2. Fig. 3. Fig. 4. Fig. 5. Fig. 6. Fig. 7.
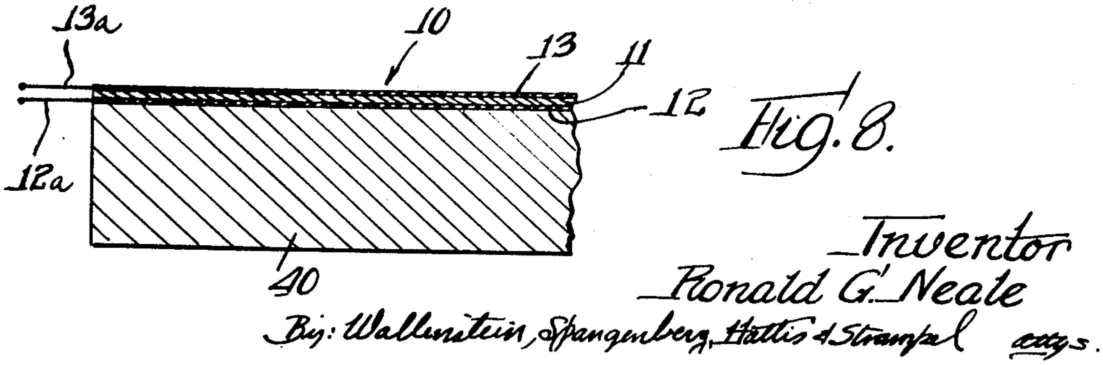
Fig. 8.
Inventor
Ronald G. Neale
By: Wallenstein, Spangenberg, Hattis & Strampel attys.

AMORPHOUS ELECTRODE OR ELECTRODE SURFACE

The semiconductor switch devices of this invention constitute improvements over the switch devices disclosed in Standford R. Ovshinsky U.S. Pat. No. 3,271,591, such switch devices including a pair of electrodes with an active semiconductor material therebetween and being of the nonmemory type and the memory type depending upon the active semiconductor materials utilized therein.

The active semiconductor materials are preferably polymeric-type materials including a plurality of chemically dissimilar elements, at least some of which are of the polymeric type having the ability to form polymeric structures. Such polymeric-type elements include boron, carbon, silicon, germanium, tin, lead, nitrogen, phosphorous, arsenic, antimony, bismuth, oxygen, sulphur, selenium, tellurium, hydrogen, fluorine and chlorine. Of these polymeric-type elements, oxygen, sulphur, selenium and tellurium are particularly useful since they, and mixtures containing them, have favorable carrier mobility characteristics. Of these polymeric-type elements, silicon, germanium, phosphorous, arsenic and the like and, also, aluminum, gallium, indium, lead, bismuth and the like are particularly useful since they effectively form covalent bonds and cross-links to return and maintain the active semiconductor materials in a substantially disordered and generally amorphous condition. Depending upon the compositions of the active semiconductor materials, the switches may be of the nonmemory type or the memory type. Examples of such materials are set forth in the aforementioned patent to provide such nonmemory and memory operations (the nonmemory devices being referred to therein as Mechanism devices and the memory devices as Hi-Lo and Circuit Breaker devices).

The active semiconductor materials are normally in the substantially disordered and generally amorphous condition providing high resistance for blocking current between the electrodes substantially equally in each direction. They have local order and/or localized bonding of the atoms and provide high resistance and a threshold voltage value. When a voltage above the threshold voltage value is applied to the electrodes, at least one current conducting filament or path is established in the semiconductor material between the electrodes which is of low resistance for conducting current substantially equally in each direction. The transverse dimensions or diameter of said at least one current conducting filament or path are determined by the amount of current flow, they increasing in accordance with increase in current density to accommodate the current flow.

In the nonmemory-type devices the active semiconductor materials in the current conducting path or paths in the low-resistance conducting condition remain substantially in the substantially disordered and generally amorphous condition, there being no significant change in structural state. The low resistance or conducting condition in the current conducting path or paths reverts to the high resistance or blocking condition when the current therethrough decreases below a minimum current holding value.

In the memory-type devices, the semiconductor material in the current conducting path or paths is subjected to changes in local order and/or localized bonding of the molecular structure, which changes are frozen in. These changes, providing changes in atomic structure and, hence, structural change in the semiconductor materials, can be from said disordered condition to a more ordered condition, such as, for example, toward a more ordered crystallinelike condition. The changes can be substantially within a short range order itself still involving a substantially disordered and generally amorphous condition, or can be from a short range order to a long range order which could provide a crystallinelike or pseudocrystalline condition, all of these structural changes, however subtle, involving at least a change in local order and/or localized bonding. These changes in structural state, which are frozen in, provide a conducting path or paths which remains even though the current therethrough is reduced to zero or reversed. To reset the memory devices to the high resistance or blocking condition, a high-current pulse is passed through the current conducting path or paths whereupon the more ordered structural state thereof is realtered to the substantially disordered and generally amorphous condition of high resistance which is frozen in. Complete reversibility between these conditions of high resistance and low resistance is at all times assured.

The principal object of this invention is to provide improved semiconductor switch devices as discussed above, whether of the nonmemory type or the memory type, wherein the active semiconductor material and the electrodes are deposited as films on a suitable substrate, wherein the substantially disordered and generally amorphous condition of the active semiconductor material film is assured, and wherein good electrical contact and strong adhesion between the semiconductor material film and the electrodes is assured.

Briefly, in accordance with this invention, the film electrodes, when they are deposited on the substrate or on the active semiconductor material, as by vacuum deposition, sputtering or the like, are deposited at low or substantially room temperature or slightly above room temperature thereon, so that the film electrodes assume a substantially disordered and generally amorphous condition, as distinguished from deposition at higher or elevated temperatures where they would assume a crystallinelike condition. Such substantially disordered and generally amorphous electrode films, which are metallic, have a low-electrical resistance and contact the active semiconductor material with low-electrical resistance of transition.

When the active semiconductor material is deposited, as by vacuum deposition, sputtering or the like, it is deposited in a substantially disordered and generally amorphous state, and since the electrodes are also substantially disordered and generally amorphous, there is no tendency for them to alter such substantially disordered and generally amorphous state of the active material, which may well be the case if the electrodes had a crystallinelike structure. In other words, there is no possibility of the deposited active semiconductor material, as it is being deposited, to follow and assume a crystallinelike structure of the electrodes, since the deposited electrodes do not have such a structure. In this way, the deposition of the active semiconductor material in a truly substantially disordered and generally amorphous state, and the maintenance of such a state is assured. Since both the active semiconductor material and the electrodes are in a substantially disordered and generally amorphous state, good electrical contact and strong adhesion therebetween are also assured.

Many other objects, features and advantages of this invention will be more fully realized and understood from the following detailed description when taken in conjunction with the accompanying drawings wherein;

FIG. 1 is a diagrammatic illustration of the current controlling or switch device made by this invention and is shown connected in series in a load circuit;

FIG. 2 is a voltage current curve illustrating the operation of the nonmemory- or threshold-type current controlling or switch device made by this invention when operated in a DC load circuit;

FIGS. 3 and 4 are voltage current curves illustrating the symmetrical operation of the nonmemory- or threshold-type device and the operation thereof when operated in an AC lead circuit;

FIG. 5 is a voltage current curve illustrating the operation of the memory-type current controlling or switch device made by this invention when operated in a DC load circuit;

FIGS. 6 and 7 are voltage current curves illustrating the symmetrical operation of the memory-type device and the operation thereof when operated in an AC load circuit; and FIG. 8 is an enlarged sectional diagrammatic view of a threshold or memory semiconductor switch device made in accordance with this invention.

For an understanding of the nature and manner of operation of the memory and nonmemory or threshold semiconductor switch devices as constructed in accordance with this invention reference is first made to FIG. 1 of the drawing where there is illustrated a typical simple load circuit which includes a semiconductor switch device 10 diagrammatically illustrated as having a semiconductor element 11 which may be of high-electrical resistance and a pair of electrodes 12 and 13 in contact therewith with low-electrical resistance of transition. The electrodes 12 and 13 of the current controlling device 10 connect the same in series in an electrical load circuit having a load 14 and a pair of terminals 15 and 16 for applying power thereto. The power supplied may be a DC voltage or an AC voltage as desired. The circuit arrangement illustrated in FIG. 1, and as so far described, is applicable for the nonmemory or threshold type of current controlling device. If a memory type of current controlling device is utilized, the circuit also includes a source of current 17, a low resistance 18 and a switch 19 connected to the electrodes 12 and 13 of the current controlling device. The purpose of this auxiliary circuit is to switch the memory-type device from its stable conducting condition of low resistance to its stable blocking condition of high resistance by the application of an energy pulse. The resistance value of the resistance 18 is preferably considerably less than the resistance value of the load 14.

The general voltage current characteristics of the semiconductor devices are shown in FIGS. 2–7 where FIG. 2 is in I–V curve illustrating the DC operation of the nonmemory- or threshold-type device 10 and in this instance the switch 19 always remains open. The device 10 is normally in its high-resistance blocking condition and as the DC voltage is applied to the terminals 15 and 16 and increased, the voltage current characteristics of the device are illustrated by the curve 20, the electrical resistance of the device being high and substantially blocking the current flow therethrough. When the voltage is increased to a threshold voltage value, the high-electrical resistance in the semiconductor material substantially instantaneously decreases in at least one path between the electrodes 12 and 13 to a low electrical resistance, the substantially instantaneous switching being indicated by the curve 21. This provides a low-electrical resistance or conducting condition for conducting current therethrough. The low-electrical resistance is many orders of magnitude less than the high-electrical resistance. The conducting condition is illustrated by the curve 22 and it is noted that there is a substantially linear voltage current characteristic and a substantially constant voltage characteristic which are the same for increase and decrease in current. In other words, current is conducted at a substantially constant voltage. In the low-resistance current conducting condition the semiconductor element has a voltage drop which is a minor fraction of the voltage drop in the high-resistance blocking condition near the threshold voltage value.

As the supply voltage is decreased, the current decreases along the curve 22 and when the current decreases below a minimum current holding value, the low-electrical resistance of said at least one path immediately returns to the high-electrical resistance as illustrated by the curve 23 to reestablish the high-resistance blocking condition. In other words, a current is required to maintain the threshold switch current controlling device in its conducting condition and when the current falls below a minimum current holding value, the low-electrical resistance immediately returns to the high-electrical resistance.

The threshold switch current controlling device 10 used in this invention is symmetrical in its operation, it blocking current substantially equally in each direction and it conducting current substantially equally in each direction, and the switching between the blocking and conducting conditions being extremely rapid. In the case of AC operation, the voltage current characteristics for the second half cycle of the AC current would be in the opposite quadrant from that illustrated in FIG. 2. The AC operation of the device is illustrated in FIGS. 3 and 4. FIG. 3 illustrates the device 10 in its blocking condition where the peak voltage of the AC voltage is below the threshold voltage value of the device, the blocking condition being illustrated by the curve 20 in both half cycles. When, however, the peak voltage of the applied AC voltage increases above the threshold voltage value of the device, the device is substantially instantaneously switched along the curves 21 to the conducting condition illustrated by the curves 22, the device switching during each half cycle of the applied AC voltage. As the applied AC voltage nears zero so that the current through the device falls below the minimum current holding value, the device switches along the curves 23 from the low-electrical resistance condition to the high-electrical resistance condition illustrated by the curve 20, this switching occuring near the end of each half cycle.

As expressed above, there is no substantial change in phase or physical structure of the threshold switch semiconductor material as it is switched between the blocking and conducting conditions, and since the semiconductor material of the element 11 is substantially disordered and generally amorphous, said at least one conducting path through the semiconductor element is also substantially disordered and generally amorphous in the conducting condition and has an apparent diameter or transverse dimension corresponding to the current flow therein. The current conducting path or paths formed through the semiconductor material have the apparent ability to acquire a diameter or transverse dimension proportional to the current density within the path or paths, and the diameter or transverse dimension of the path or paths decreases with decreasing current and increases with increasing current so as to maintain a substantially constant voltage drop across said path or paths irrespective of the amount of current flow therethrough.

FIG. 5 is an I–V curve illustrating the DC operation of the memory switch-type current controlling device 10. The device is normally in its high-resistance blocking condition and as the DC voltage is applied to the terminals 15 and 16 and increased, the voltage current characteristics of the device are illustrated by the curve 30, the electrical resistance of the device being high and substantially blocking the current flow therethrough. When the voltage is increased to a threshold voltage value, the high-electrical resistance in the semiconductor element 11 substantially instantaneously decreases in at least one path between the electrodes 12 and 13 to a low-resistance conducting condition, the substantially instantaneous switching being indicated by the curve 31. The low-electrical resistance is many orders of magnitude less than the high-electrical resistance. The conducting condition is illustrated by the curve 32 and it is noted that there is a substantially ohmic voltage current characteristic. In other words, current is conducted substantially ohmically as illustrated by the curve 32. In the low-resistance current conducting condition and semiconductor material has a voltage drop which is a minor fraction of the voltage drop in the high-resistance blocking condition near the threshold voltage value. Here, it is believed that the conductive path or paths, which may be considered as a filament or filaments permanently formed in the semiconductor material, is of substantially fixed diameter during variation of current flow therethrough, and the diameter or transverse dimension of the path or paths is principally determined at the time of initial conduction in accordance with the amount of current passing therethrough such that when the current conducting path or paths is frozen in, only large amounts of current flow will cause sufficient heating within the semiconductor material in the region of said path or paths to cause the path or paths to increase in diameter or transverse dimension.

As the voltage is decreased, the current decreases along the curve 32 and due to the ohmic relation the current decreases to zero as the voltage decreases to zero. The memory-type current controlling device has memory of its conducting condition and will remain in this conducting condition even though the current is decreased to zero or reversed until switched to its blocking condition as hereafter described. The load line of the load circuit is illustrated at 33, it being substantially parallel to the switching curve 31. When a DC current pulse is applied independently of the load circuit to the memory-type device as by the voltage source 17, low resistance 18 ans switch 19 in FIG. 1, the load line for such current is along the line 34 since there is very little, if any, resistance in this control circuit, and as the load line 34 intersects the curve 30, the conducting condition of the device is immediately realtered and switched to its blocking condition until switched to its conducting condition by the reapplication of a threshold voltage to the device through the terminals 15 and 16.

The memory switch-type current controlling device 10 used in this invention is also symmetrical in its operation, it blocking current substantially equally in each direction and it conducting current substantially equally in each direction, and the switching between the blocking and conducting conditions being extremely rapid. In the case of AC operation, the voltage current characteristics for the second half cycle of the AC current would be in the opposite quadrant from that illustrated in FIG. 5. The AC operation of the memory-type device is illustrated in FIGS. 6 and 7. FIG. 6 illustrates the device 10 in its blocking condition where the peak voltage of the AC voltage is below the threshold voltage value of the device, the blocking condition being illustrated by the curve 30 in both half cycles. Thus, the device blocks current equally in both half cycles. When, however, the peak voltage of the applied AC voltage increases above the threshold value of the memory-type device, the device substantially instantaneously switches to the conducting condition illustrated by the curve 32 and it remaining in this conducting condition regardless of the reduction of the current to zero or the reversal of the current. This symmetrical conducting condition is illustrated by the curve 32 in FIG. 7.

When the switch 19 is manipulated and the voltage applied to the terminals 15 and 16 is below the threshold voltage value, the memory switch-type current controlling device 10 is immediately switched to its blocking condition as illustrated by the curve 30 in FIG. 6. As expressed above, the semiconductor element is substantially disordered and generally amorphous in its blocking condition and said at least one path through the element is more ordered in the conducting condition. Therefore, in contrast to the nonmemory or threshold switch-type materials, the local order and localized bonding of the substantially disordered and generally amorphous condition of the memory switch-type material can be altered so that a conducting path or paths is established in the material in a quasi permanent manner. In other words, the conductivity of the memory switch-type semiconductor materials may be drastically altered to provide a conducting path or paths in the material which are frozen in and have a diameter corresponding to the initial current flow therethrough but which can be realtered to its original high-resistance condition by the application of an energy pulse, for example a current pulse, through the conducting path or paths.

The electrodes which are utilized in semiconductor switch devices of this invention may be substantially any good electrical conductor, preferably high melting point materials, such as tantalum, niobium, tungsten and molybdenum or mixtures thereof, it being understood that other materials may be used. These electrodes are usually relatively inert with respect to the various aforementioned active semiconductor materials, when deposited as thin films ro layers. Exceptionally fine results have been obtained by using molybdenum as the electrode material.

In accordance with this invention reference is now made to FIG. 8 wherein there is shown a switching device designated generally by number 10. Here, the switching device 10 is a film deposited structure formed on a substrate 40 which may be of conductive, semiconductive, or insulative materials, as desired. For reference here, it is assumed that the substrate is insulating and made of glass. A conductive electrode 12 of good electrical and high melting properties, as, for example, the metals referred to above, and preferably molybdenum, is deposited on the substrate 40 in a manner to obtain a substantially disordered and generally amorphous condition of such conductive materials. The desired amorphous electrode or electrode surface may be obtained by vacuum deposition, sputtering or the like onto the surface of the substrate 40 which is maintained at a sufficiently low temperature to cause the material so deposited to freeze in on the surface thereof in the desired substantially disordered and generally amorphous condition.

A film of active semiconductor material 11, either of the nonmemory or memory type, is deposited over the deposited electrode 12 and is in a substantially disordered and generally amorphous condition. This deposition may be accomplished by vacuum deposition, sputtering or the like. Since both the nonmemory and memory semiconductor materials are substantially disordered and generally amorphous materials with only a current conducting path or paths formed therethrough by the application of a voltage above a threshold voltage value, it is desired that this substantially disordered and generally amorphous condition be preserved throughout the entire volume or thickness of the semiconductor material. This is of particular importance when very thin layers or films of semiconductor materials are placed in contact with electrode surfaces which would tend to cause the semiconductor material to form regimented or crystalline patterns in conformity with regularities or irregularities of the electrode surface. With active semiconductor film thicknesses of, for example, a micron or less such regimentation of molecular structure would persist through a substantial percentage of the total thickness of the semiconductor material. Therefore, in accordance with this invention electrodes or electrode surfaces of substantially disordered and generally amorphous conductive materials ensure that very thin layers or films of substantially disordered generally amorphous active semiconductor material in contact with such electrodes or electrode surfaces will remain in such disordered and amorphous conditions throughout the entire thickness thereof.

Over this film of active semiconductor material 11 there is deposited a conductive electrode 13 which may be the same or different material than the material forming the conductive electrode 12 and it also is formed to be a substantially disordered and generally amorphous condition in the same manner as the electrode 12. Although the exemplary form of the invention shown herein illustrates electrodes on opposite sides of the layer of semiconductor material 11, it will be understood that the conductive electrodes may be formed on the same side of the semiconductor material, if desired, by first depositing the electrodes on the substrate and then depositing the active semiconductor material thereover. Suitable leads 12*a* and 13*a* may be connected to the layers or films of conductive electrodes by any suitable means thus providing means for connecting the switching device 10 into a circuit.

Accordingly, the switching device 10 of this invention has a layer or film of substantially disordered and generally amorphous semiconductor material in contact with substantially disordered and generally amorphous conductive electrodes 12 and 13 with low-electrical resistance of transition therewith and strong adhesion therebetween.

By the term "substantially disordered and generally amorphous" and the term "amorphous" as utilized herein in connection with the structure of the deposited film of semiconductor material and the deposited films of high melting point conductive material, it is meant that such structures are in a locally organized disordered solid state condition which is generally amorphous (not crystalline or polycrystalline) but which may possibly contain relatively small crystals or crystallites which would probably be maintained in randomly oriented position therein.

While for purposes of illustration one form of this invention has been disclosed, other forms thereof may become apparent to those skilled in the art upon reference to this disclosure and, therefore, this invention is to be limited only by the scope of the appended claims.

I claim:

1. A switch device comprising in combination, a substrate, a deposited film of amorphous semiconductor material on said substrate and forming the active switch material of the device, and a pair of deposited spaced-apart films of high melting point conductive material on said substrate in contact with said film of amorphous semiconductor material to form the electrodes of the switch device, said deposited active amorphous semiconductor switch material being of relatively high resistance and including means for establishing at least one current conducting path of relatively low resistance between the electrodes in response to the application of a voltage to the electrodes above a threshold voltage value, said deposited electrodes of high melting point conductive material also being amorphous so as not to alter the amorphous condition of said active switch material toward a crystalline condition.

2. A switch device as defined in claim 1 wherein said semiconductor material includes means for reverting said at least one conducting path of relatively low resistance to the relatively high resistance blocking state when the current therethrough decreases below a minimum current holding value.

3. A switch device as defined in claim 1 wherein said semiconductor material includes means for maintaining said at least one conducting path of relatively low resistance in the relatively low-resistance conducting state even though the current therethrough decreases to zero, and for realtering said at least one conducting path of relatively low resistance to the relatively high-resistance blocking state in response to a current pulse applied to the electrodes.

4. A switch device as defined in claim 1 wherein said films of high melting point conductive material are deposited at low temperatures to provide the amorphous condition thereof.

5. The switch device according to claim 1 wherein said films of high melting point conductive material are selected from the group consisting of tantalum, niobium, tungsten and molybdenum.